(12) United States Patent
Matsubara et al.

(10) Patent No.: US 9,111,716 B2
(45) Date of Patent: Aug. 18, 2015

(54) CHARGED PARTICLE MICROSCOPE

(71) Applicant: Hitachi High-Technologies Corporation, Tokyo (JP)

(72) Inventors: Shinichi Matsubara, Tokyo (JP); Yoshimi Kawanami, Tokyo (JP); Hiroyuki Tanaka, Tokyo (JP); Hiroyasu Shichi, Tokyo (JP); Yoichi Ose, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/397,466

(22) PCT Filed: Apr. 24, 2013

(86) PCT No.: PCT/JP2013/061963
§ 371 (c)(1),
(2) Date: Oct. 27, 2014

(87) PCT Pub. No.: WO2013/161837
PCT Pub. Date: Oct. 31, 2013

(65) Prior Publication Data
US 2015/0083930 A1      Mar. 26, 2015

(30) Foreign Application Priority Data

Apr. 27, 2012    (JP) ................................. 2012-102035

(51) Int. Cl.
| | |
|---|---|
| *H01J 37/26* | (2006.01) |
| *H01J 37/08* | (2006.01) |
| *H01J 27/26* | (2006.01) |
| *H01J 27/02* | (2006.01) |
| *H01J 37/28* | (2006.01) |

(52) U.S. Cl.
CPC ................. *H01J 37/08* (2013.01); *H01J 37/28* (2013.01); *H01J 2237/002* (2013.01); *H01J 2237/006* (2013.01); *H01J 2237/0807* (2013.01)

(58) Field of Classification Search
USPC .......... 250/306, 307, 309–311, 423 F, 432 R, 250/429, 443.1, 526
See application file for complete search history.

(56) References Cited

U.S. PATENT DOCUMENTS

| | | | |
|---|---|---|---|
| 8,115,184 B2 * | 2/2012 | Shichi et al. ............. | 250/492.21 |
| 2009/0152462 A1 * | 6/2009 | Ishitani et al. ................ | 250/307 |
| 2009/0173888 A1 * | 7/2009 | Shichi et al. .................. | 250/397 |
| 2012/0097863 A1 * | 4/2012 | Saho et al. .................. | 250/443.1 |
| 2012/0132802 A1 * | 5/2012 | Arai et al. ..................... | 250/310 |

(Continued)

FOREIGN PATENT DOCUMENTS

| | | | |
|---|---|---|---|
| JP | 58-85242 A | 5/1983 | |
| JP | 3-17936 A | 1/1991 | |

(Continued)

*Primary Examiner* — Bernard E Souw
(74) *Attorney, Agent, or Firm* — Miles & Stockbridge P.C.

(57) ABSTRACT

The ionized gas supplied to the emitter tip of a gas field ionization ion source is cooled and purified to enable supplying a reliable and stable ion beam. Impurities contained in the ionized gas destabilize the field ionization ion source. The invention is configured to include a first heat exchanger thermally connected to a part of the field ionization ion source, a cryocooler capable of cooling a second gas line and a cold head, the second gas line being connected to the first heat exchanger and circulating a refrigerant, and a second heat exchanger that cools the first and second gas lines and is connected to the cold head.

9 Claims, 7 Drawing Sheets

(56) References Cited

U.S. PATENT DOCUMENTS

2012/0217391 A1* 8/2012 Shichi et al. .................. 250/306
2013/0126731 A1* 5/2013 Shichi et al. .................. 250/310
2014/0299768 A1* 10/2014 Shichi et al. .................. 250/310

FOREIGN PATENT DOCUMENTS

| JP | 2011-14245 A | 1/2011 |
|----|--------------|--------|
| WO | WO 2011/055521 A1 | 5/2011 |

* cited by examiner

CHARGED PARTICLE MICROSCOPE

TECHNICAL FIELD

The present invention relates to a charged particle microscope.

BACKGROUND ART

Observation of a sample surface structure is possible through detection of the secondary electron charged particles released by the sample scanned and irradiated with electrons. This is called scanning electron microscope (hereinafter, "SEM"). Another way to observe a sample surface structure is through detection of the secondary charged particles released by the sample scanned and irradiated with an ion beam. This is called scanning ion microscope (hereinafter, "SIM").

Such surface observation preferably uses light ion species such as hydrogen and helium. Lighter ion species are preferred for their weak sputtering effect, minimizing the damage to a sample surface. Another characteristic of these ion beams is the higher sensitivity to the information of a sample surface than that of electron beams. Hydrogen and helium ions are more sensitive because the excitation region of secondary charged particles upon entry of these ions into a sample surface occurs by being localized more toward the sample surface than the excitation region occurring upon electron beam irradiation. Another disadvantage of electron beams is that the wave property of electrons cannot be ignored, and the diffraction effect causes aberration. The ion beams, on the other hand, are heavier than electrons, and the diffraction effect is negligible.

Information that reflects the inner structure of a sample can be obtained by detecting ions that passed through the sample irradiated with ion beams. This is called transmission ion microscopy. Lighter ion species such as hydrogen and helium are particularly preferred for observation because a large proportion of these ions passes through a sample upon irradiation of the sample with these ions.

On the other hand, heavy ion species such as oxygen, nitrogen, argon, krypton, xenon, gallium, and indium are preferred for the working of a sample because these ions can have a sputtering effect on the irradiated sample. A focused ion beam device using a liquid metal ion source represents a known specific example of ion beam processing devices.

A gas field ionization ion source is the preferred ion source for ion microscopy. In a gas field ionization ion source, high voltage is applied to the metal emitter tip having an apex curvature radius of about 100 nm or less to concentrate an electric field at the apex, and a gas (ionized gas) is introduced near the apex to ionize the gas molecules in the field and obtain an ion beam. A gas field ionization ion source can generate an ion beam of a narrow energy width. Further, the small size of the ion source enables generating a fine ion beam.

Ion microscopy requires producing an ion beam of a large current density on a sample to obtain a sample image with little noise. This requires increasing the ion emission angle current density of the field ionization ion source. The ion emission angle current density can be increased by increasing the density of the ionized gas in the vicinity of the emitter tip.

Cooling the emitter tip to extreme low temperatures lowers the energy of the ionized gas molecules that collided with the emitter tip, and the ionized gas molecules aggregate and increase their density. The pressure of the ionized gas introduced near the emitter tip also can be increased. However, problems occur when the pressure of the introduced gas is 1 Pa or higher. Specifically, the ion beam neutralizes as it collides with the ionized gas, and the ion beam current decreases, or undergoes a glow discharge. A known solution to these problems is to restrict the gas ionization region with a projection of several atoms formed at the apex of the emitter tip, and improve ion emission angle current density by efficiently ionizing the limited supply of ionized gas.

Specifically, PTL 1 discloses improving ion source characteristics with a fine protrusion formed at the apex of the emitter tip.

PTL 2 discloses a charged particle microscope that enables high-resolution sample observation with a compact ion irradiation system that has a reduced ion optical length to reduce the amplitude of the relative vibrations of the emitter tip and the sample.

PTL 3 discloses an ion microscope. The main body of the ion microscope is independently installed from a cryocooler for cooling a gas field ionization ion source, and the mechanical vibration of the cryocooler that propagates to the gas field ionization ion source is reduced by the provision of a refrigerant circulation circuit cooling mechanism that circulates a refrigerant between the gas field ionization ion source and the cryocooler. In this way, the ion microscope can improve the brightness of the gas field ionization ion source while ensuring the ion beam convergence.

CITATION LIST

Patent Literature

PTL 1: JP-A-58-85242
PTL 2: WO2011/055521
PTL 3: JP-A-2011-14245

SUMMARY OF INVENTION

Technical Problem

The gas field ionization ion source with a projection of several atoms formed at the apex of the emitter tip has the following problems.

The gas field ionization ion source requires introducing an ionized gas near the emitter tip, as described above. Any inclusion of impurity gas in the ionized gas may cause the impurity gas molecules to desorb near the apex of the emitter tip. The molecule desorption deforms the shape of the emitter tip at the apex, and the electric field fluctuates near the apex. Such electric field fluctuations cause the ion beam current to fluctuate.

Another problem is the influence of the ion beam release from portions where the adhesion of the impurity gas has taken place. The portions with the adhered impurity gas project out in a size determined by the size of the impurity gas, and involve a higher electric field than other portions. This may cause emission of ion beams from these high electric field portions. For every ion beam emission from the impurity gas adsorbed portions, the ionized gas is consumed at these portions in amounts that correspond to the ion beam emission. This reduces the supply of ionized gas from the atom portions intended as an ion source, and causes the ion beam current to fluctuate.

Prior to making the invention, the present inventors identified the problem that the ion source becomes unstable for the reasons described above.

When the impurity gas is a gas species that reacts with the metal forming the emitter tip, the impurity gas may destroy the projection of several atoms formed at the apex of the emitter tip. The projection at the apex of the emitter tip needs to be reconstructed when destroyed. This is problematic in terms of user friendliness of the device. The present inventors found that the ease of maintaining the projection for extended time periods depends on the type of the ionized gas used, and the gas purity, and that these factors make it difficult to observe a sample in high resolution.

This problem can be solved by removing the impurity gas from the ionized gas, specifically by purifying the ionized gas. The present inventors looked at the notably higher vapor pressures of certain ionized gas species such as helium, neon, and hydrogen commonly used for observation purposes than those of other gas species, and found that the ionized gas can be efficiently purified by cooling the ionized gas. Specifically, the ionized gas can be cooled to aggregate impurity gases such as nitrogen, oxygen, and hydrocarbon, and introduce only the gas of interest near the emitter tip.

It is an object of the present invention to improve the reliability of a gas field ionization ion source at low cost by purifying an ionized gas with a cooling system intended to cool the emitter tip and improve the ion emission angle current density.

Solution to Problem

A representative example of the present invention is as follows. A charged particle microscope that has a field ionization ion source includes:
an emitter tip having a needle-like apex;
an ionization chamber having the emitter tip inside the chamber;
a first heat exchanger connected to a part of the ionization chamber via a cooling conductor,
a cryocooler having a second heat exchanger,
a first gas line that supplies a gas to the ionization chamber via the second heat exchanger; and
a second gas line thermally connected to the first heat exchanger and the second heat exchanger.

Advantageous Effects of Invention

The present invention enables a stable supply of an ion beam in a charged particles beam apparatus that irradiates a sample with an ion beam for sample observation.

DESCRIPTION OF EMBODIMENTS

Figure 1:
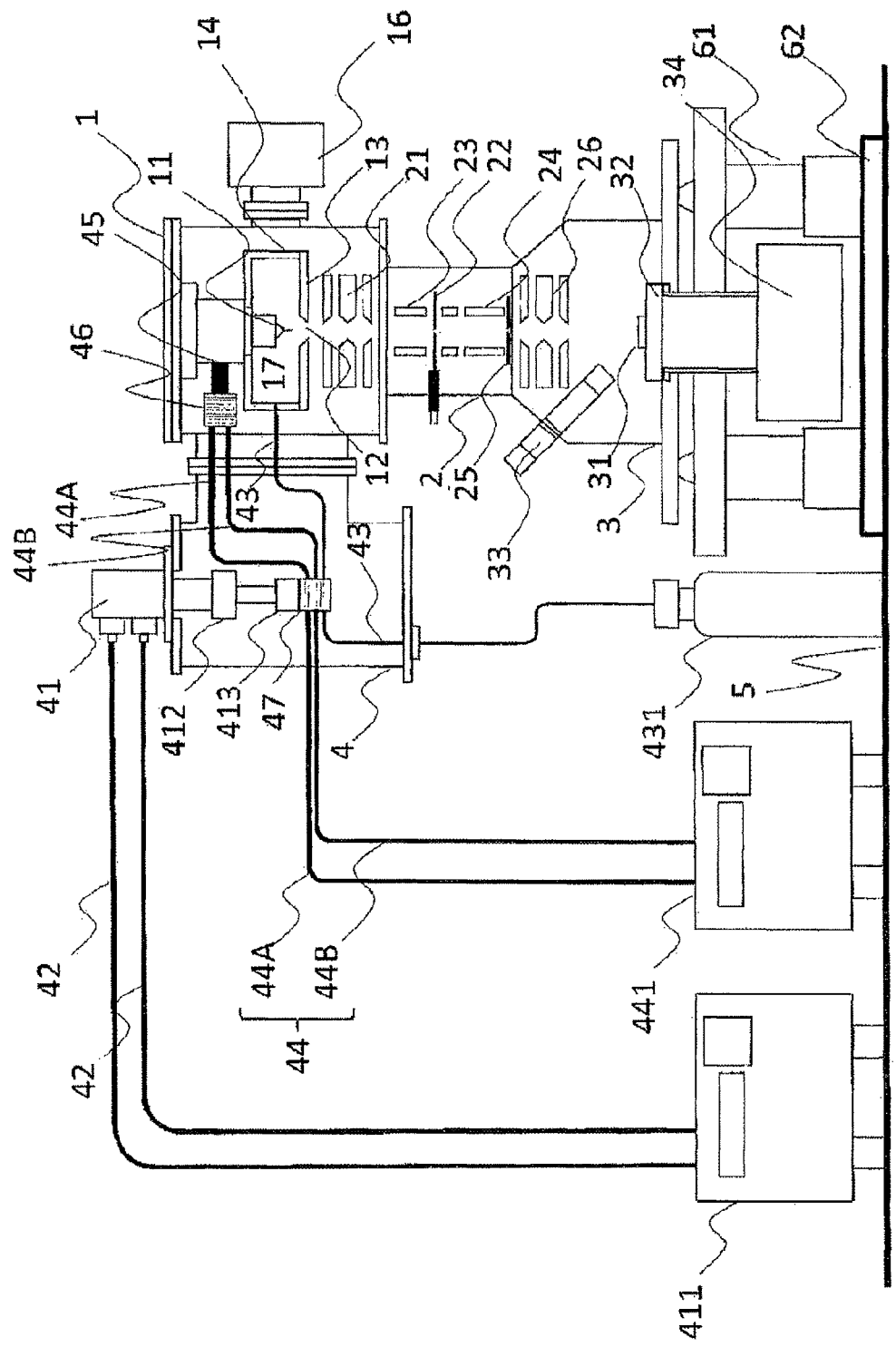
FIG. 1 is a diagram representing a schematic structure of an example of the charged particles beam apparatus according to the present invention.

The present invention is a charged particle microscope that includes: a field ionization ion source provided with an emitter tip having a needle-like apex, an ionization chamber containing the emitter tip inside the chamber, a first gas line that supplies a gas into the ionization chamber, and an extraction electrode disposed opposite the emitter tip; a sample holder for holding a sample; and a lens group for converging an ion beam. The charged particle microscope includes a first heat exchanger thermally coupled to a part of the field ionization ion source, a cryocooler capable of cooling a second gas line and a cold head, the second gas line being connected to the first heat exchanger and circulating a refrigerant, and a second heat exchanger connected to the cold head that cools the first and second gas lines. This makes it possible to efficiently purify the ionized gas supplied into the ionization chamber. Specifically, with the structure adapted to cool the first gas line with the second heat exchanger, the impurity gas contained in the ionized gas running through the first gas line aggregates at the cooled portions of the first gas line. Further, the gas can be purified at low cost because the second heat exchanger and the cryocooler, provided as essential components for cooling the emitter tip and improving the brightness of the ion beam to obtain a high-resolution observation image, are also used to cool the first gas line.

The present invention is a charged particle microscope that includes a field ionization ion source provided with an emitter tip having a needle-like apex, an ionization chamber containing the emitter tip inside the chamber, a first gas line that supplies a gas into the ionization chamber, and an extraction electrode disposed opposite the emitter tip; a sample holder for holding a sample; and a lens group for converging an ion beam. The charged particle microscope includes a first heat exchanger thermally coupled to a part of the field ionization ion source, a cryocooler capable of cooling a second gas line and a cold head, the second gas line being connected to the first heat exchanger and circulating a refrigerant, a second heat exchanger connected to a vacuum chamber retaining a gas molecule supplied to the first gas line, and to the cold head that cools the vacuum chamber and the second gas line, and a gas flow rate adjusting mechanism provided on the first gas line joining the gas-containing vacuum chamber and the ionization chamber. In this way, the quantity of the purified gas that can be supplied to the field ionization ion source can be increased. This is possible because a large quantity of ionized gas retained in the vacuum chamber can be purified at once with the configuration in which the cryocooler is adapted to cool the vacuum chamber that can retain the ionized gas. This makes it possible to stably introduce a large quantity of ionized gas to the field ionization ion source for consumption.

With the flow rate adjusting mechanism provided on the first gas line between the vacuum chamber and the ionization chamber, the supply of the ionized gas to the field ionization ion source can be suspended until the purification is finished. This enables the ionized gas to be purified without sacrificing the reliability of the field ionization ion source. The flow rate adjustment also enables adjusting the ionized gas pressure inside the ionization chamber.

The present invention is a charged particle microscope that includes a field ionization ion source, a device mount for supporting a sample holder and a lens group, and an antivibration mechanism that reduces the vibration of the device mount, and in which the cryocooler is supported on a mount different from the device mount. In this way, the emitter tip and the ionized gas can be cooled without transmitting the vibration of the cryocooler to the emitter tip or the sample holder. By reducing the vibration, the amplitudes of the relative vibrations of the emitter tip and the sample become smaller, and the sample can be observed at high resolutions.

The charged particle microscope may be adapted to include a pipe that vacuum insulates the first and second gas lines, and in which the outer walls of the first and second gas lines are partially or entirely in contact with each other. In this way, the first gas line can be cooled to about the same temperature as that of the refrigerant circulating inside the second gas line. This makes it possible to introduce the cooled purified ionized gas into the ionization chamber while maintaining the purity.

The charged particle microscope may be adapted so that the cryocooler is a Gifford-McMahon (GM) cryocooler or a pulse tube cryocooler. This makes it easier to continuously operate the charged particle microscope.

The charged particle microscope is adapted so that the cryocooler is a container capable of retaining liquid nitrogen, that the liquid nitrogen inside the container is solidifiable with the use of a means that can lower the pressure inside the container. This makes it possible to cool the emitter tip and the ionized gas relatively inexpensively. It is also possible to suppress the vibration of the cryocooler.

The present invention is a charged particle microscope that includes a field ionization ion source provided with an emitter tip having a needle-like apex, a first gas line that supplies a gas molecule near the emitter tip, and an extraction electrode disposed opposite the emitter tip; a sample holder for holding a sample; and a lens group for converging an ion beam. The charged particle microscope includes a first heat exchanger thermally coupled to a part of the field ionization ion source, a cryocooler capable of cooling a second gas line and a cold head, the second gas line being connected to the first heat exchanger and circulating a refrigerant, and a second heat exchanger connected to the cold head that cools the second gas line. The first gas line and the second gas line are connected to each other with a mechanism that can adjust the flow rate, and the refrigerant circulating inside the second gas line can be partially supplied to the ionization chamber. In this way, for example, a gas, such as helium, neon, argon, and hydrogen, that can be used as an ionized gas can be selected as the refrigerant that circulates inside the second gas line, introduced into the ionization chamber. Because the refrigerant circulating inside the second gas line is cooled by the second heat exchanger and the cryocooler, the ionized gas is purified by the impurity gas aggregation effect. This makes it possible to inexpensively purify the ionized gas, and introduce the purified ionized gas into the ionization chamber.

Referring to FIG. 1, the following describes an example of the charged particles beam apparatus according to the present invention. An ion beam apparatus as a first example of a scanning ion microscope is described first. The scanning ion microscope of this example includes a gas field ionization ion source 1, an ion beam irradiation column 2, a sample chamber 3, and a cryogenic mechanism 4. The gas field ionization ion source 1, the ion beam irradiation column 2, the sample chamber 3, and the cooling mechanism 4 are vacuum chambers.

The gas field ionization ion source 1 includes a needle-like emitter tip 11, and an extraction electrode 13 provided opposite the emitter tip 11 and having an opening 12 through which ions pass through. In this example, an ionization chamber outer wall 14 covers the emitter tip 11, and forms an ionization chamber 17. However, the ionization chamber outer wall 14 may be formed so that it shares the same outer wall with the vacuum chamber of the gas field ionization ion source section.

The beam irradiation column 2 includes a focusing lens 21 that focuses the ions released by the gas field ionization ion source 1; a first aperture 22 movably provided to restrict an ion beam 15 that has passed through the focusing lens 21; a first deflector 23 that scans or aligns the ion beam 15 that has passed through the first aperture 22; a second deflector 24 that deflects the ion beam 14 that has passed through the first aperture 22; a second aperture 25 that restricts the ion beam 15 that has passed through the first aperture; and an objective lens 26 through which the ion beam 15 that has passed through the first aperture 22 and the second aperture 25 are focused on a sample 31.

Inside the sample chamber 3 are provided a sample stage 32 for mounting the sample 31, and a secondary particle detector 33. The ion beam 15 from the gas field ionization ion source 1 irradiates the sample 31 through the ion beam irradiation column 2. The secondary particles from the sample 31 are detected by the secondary particle detector 33. There are also provided an electron gun for neutralizing the charge of the sample irradiated with the ion beam, and a gas gun for supplying a gas near the sample, though not illustrated. The gas gun supplies gases such as a deposition gas, and a charge neutralization gas.

The cooling mechanism 4 is a mechanism that cools various parts of the apparatus, including inside of the field ionization ion source 1, the emitter tip 11, the extraction electrode 12, and the ionization chamber. When the cooling mechanism 4 uses, for example, a Gifford-McMahon (GM) cryocooler, a compressor unit 411 (compressor) for circulating a helium gas is installed, and is connected to a cryocooler main body 41 with a cryogenic pipe 42. Typically, certain parts of the cryocooler main body 41 are suited for the transfer of the cooling capacity of the cryocooler main body 41. For example, in the case of FIG. 1 using a GM cryocooler, the portion suited for cooling is a first cold head 412 that has higher cryogenicity than a second cold head 413 (described later), and is coolable from relatively higher temperatures. A second cold head 413 that has a lower cryogenicity temperature than the first cold head 412, and is coolable to a relatively lower temperature may also represent such a suitable cooling portion.

A first gas line 43 and a second gas line 44 are connected to the second cold head 413 via a second heat exchanger 47. An ionized gas, such as helium, neon, argon, and hydrogen, supplied from a gas cylinder 431 is introduced near the emitter tip 11 through the first gas line. The ionized gas is cooled by at least the second heat exchanger as it is supplied from the gas cylinder 431. The first gas line 43 may be connected to the first cold head 412, or to a part of the second gas line via a heat exchanger other than the second heat exchanger 47. Such an additional interconnection enables preliminary cooling of the ionized gas, and reduces the thermal load on the cryocooler, making it possible to cool the gas to even lower temperatures. An example of the apparatus configuration concerning the preliminary cooling will be described later in detail.

The heat exchanger may be one obtained by winding and welding a refrigerant or ionized gas pipe to a material having good thermal conductivity, for example, such as copper. Maximizing the pipe length can improve the heat exchange efficiency, and enable a large quantity of refrigerant or ionized gas to be cooled to even lower temperatures. Inside the pipe of the heat exchanger may be a porous material having a larger surface area, for example, such as sintered fine particles of activated carbon or metal filling the pipe. Filling the pipe with such a large-surface-area material improves the heat exchange efficiency, and enables a large quantity of refrigerant or ionized gas to be cooled to even lower temperatures.

The first gas line 43 and the second gas line 44 may be adapted to evacuate with a vacuum pump (not illustrated). The vacuum pump may be, for example, an evaporable getter pump such as a rotary pump, a scroll pump, a turbo-molecular pump, a sputter ion pump, and a Ti sublimation, or a non-evaporable getter pump. These devices may be used alone or in a configuration as a combination of different devices to evacuate and create a vacuum. The purity of the refrigerant or ionized gas can be increased by performing preliminary evacuation with such a device configuration before introducing the refrigerant or ionized gas.

The first gas line 43 and the second gas line 44 may be configured to be heatable with heating means such as a heater (not illustrated). Heating with a heater or the like during preliminary evacuation can accelerate the desorption of the adsorbed gas inside the gas lines, and improve the degree of vacuum inside the gas lines prior to the introduction. That is, the purity of the ionized gas or refrigerant can improve.

The emitter tip 11 is cooled as a refrigerant such as helium gas, neon gas, and nitrogen gas circulates between a first heat exchanger 46 and a second heat exchanger 47 through the second gas line 44, and transfers the cooling heat to a cooling conductor 45. A compressor unit 441 is used for the circulation of the refrigerant. The cooling conductor 45 is connected to a part of the gas field ionization ion source, specifically, the emitter tip 11, the extraction electrode 13, or the ionization chamber outer wall 14. The second gas line 44 may be connected to the first cold head 412 via a heat exchanger different from the second heat exchanger 47. The portions of the second gas line 44 where the refrigerant is directed toward the first heat exchanger and returns from the first heat exchanger 46 may also be connected to each other via a heat exchanger different from the second heat exchanger 47. Such an additional interconnection enables preliminary cooling of the refrigerant, and reduces the thermal load on the cryocooler, making it possible to cool the refrigerant to even lower temperatures. An example of the apparatus configuration concerning the preliminary cooling will be described later in detail. Preferably, the cold head is cooled to a temperature of 70 K or less.

The scanning ion microscope of this example further includes an ion source evacuation pump 16 that evacuates the gas field ionization ion source 1, and a sample chamber evacuation pump 34 that evacuates the sample chamber 3. On a device mount 6 disposed on a floor 5 is a base plate 62 disposed via an antivibration mechanism 61. The base plate 62 supports the field ionization ion source 1, the ion beam irradiation column 2, the sample chamber 3, and the cooling mechanism 4.

With this configuration, the impurity gas contained in the ionized gas aggregates at the cooled portions of the first gas line, and the ionized gas of improved purity can be constantly introduced into the ionization chamber. Further, the gas can be purified at low cost because the second heat exchanger 47 and the cryocooler are provided as essential components for cooling the emitter tip and improving the brightness of the ion beam to obtain a high-resolution observation image.

Figure 2:
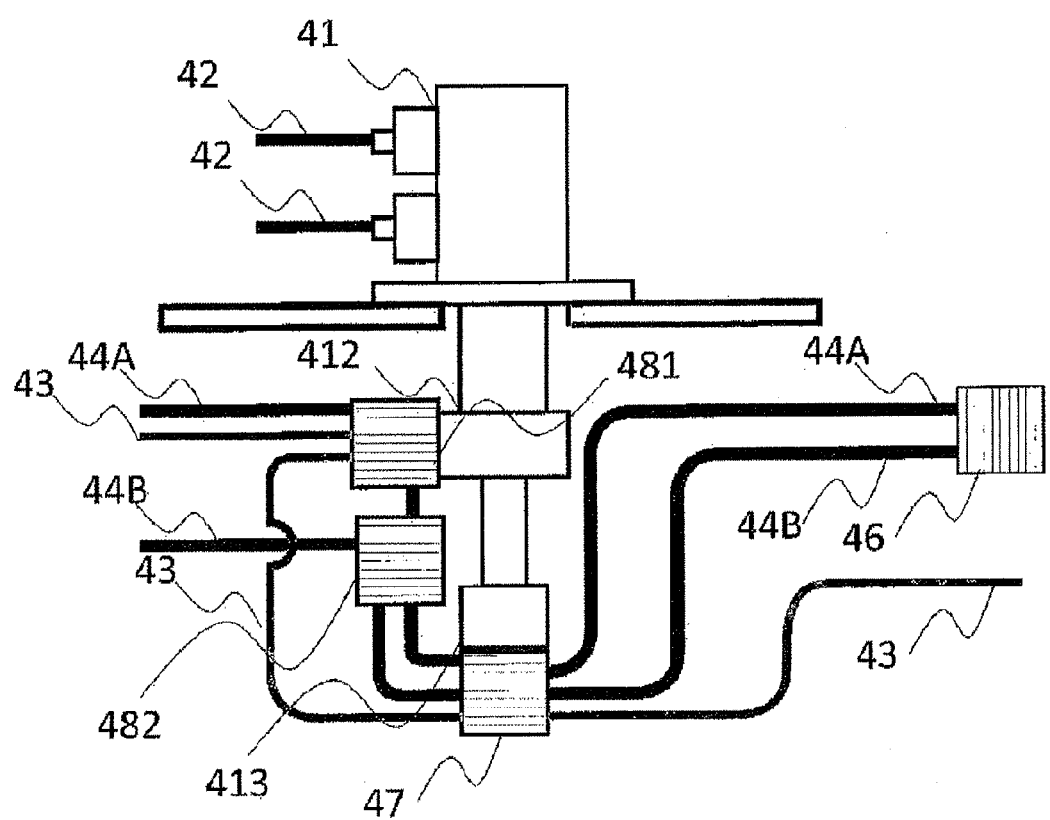
FIG. 2 is a diagram representing a schematic structure of a cooling mechanism in the example of the charged particles beam apparatus according to the present invention.

FIG. 2 represents an example in which the first gas line and the second gas line connected to the second cold head 413 are preliminarily cooled with the configuration of the ion microscope of the present invention shown in FIG. 1. The first gas line is cooled with a third heat exchanger 481 connected to the first cold head 412, and with the second heat exchanger 47 connected to the second cold head 413. The second gas line is cooled with the third heat exchanger 481 connected to the first cold head 412, and with the second heat exchanger 47 connected to the second cold head 413. In a fourth heat exchanger 482, a heat exchange takes place between the outgoing and incoming second gas lines. With this configuration, the thermal load on the cryocooler can be reduced, and the emitter tip and the ionized gas can be cooled to even lower temperatures. The GM cryocooler is used alone in the examples of FIGS. 1 and 2; however, the present invention also encompasses use of more than one GM cryocooler.

It should be noted, however, that a characteristic feature of the present invention is that the first gas line 43 and the second gas line 44 are both connected to at least one heat exchanger. This configuration enables desirably cooling the both gas lines, and supplying a high purity ionized gas to the emitter tip 11, and makes it possible to inexpensively provide a reliable ion microscope with the least number of cryocoolers.

Figure 3:
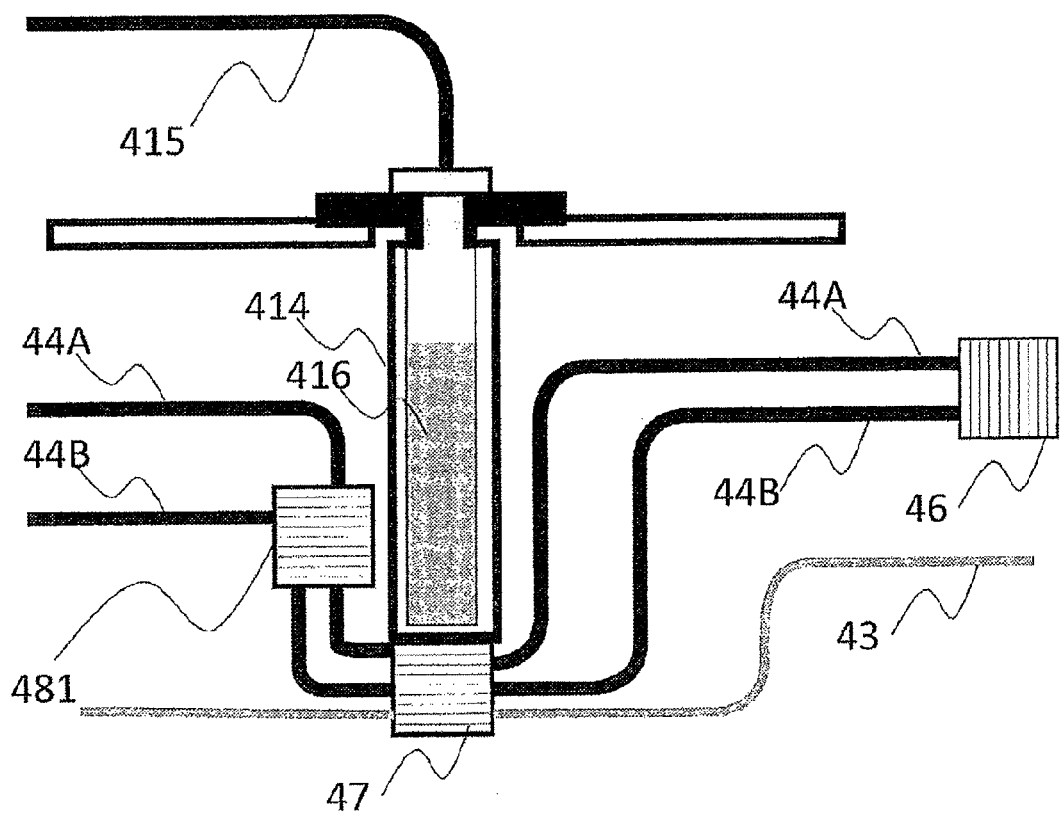
FIG. 3 is a diagram representing a schematic structure of a cooling mechanism in the example of the charged particles beam apparatus according to the present invention.

FIG. 3 represents a configuration in which a container 414 retaining a refrigerant is used to cool the emitter tip and the ionized gas instead of using the GM cryocooler. In this configuration, the second heat exchanger is connected to the container 414 retaining a refrigerant 416. The refrigerant 416 may be, for example, liquid nitrogen, solid nitrogen, liquid neon, or liquid helium. The first gas line and the second gas line are connected via the second heat exchanger to the container retaining the refrigerant, and are cooled by the latent heat of the refrigerant 416. A evacuation pipe 415 is attached to the container 414 retaining the refrigerant 416. The container 414 retaining the refrigerant 416 can be vacuumed with a pump (not illustrated) via the evacuation pipe 415. The vacuuming lowers the pressure inside the container, and can lower the temperature of the refrigerant 416 retained therein. When the refrigerant 416 is liquid nitrogen, the vacuuming can promote a phase transition from liquid nitrogen to solid nitrogen. The transition from liquid to solid can reduce the apparatus vibrations caused by boiling of the liquid nitrogen. In a scanning ion microscope, any relative vibrations of the emitter tip and a sample cause the sample image resolution to deteriorate. The vacuuming can reduce such sample resolution deterioration to some extent.

Figure 4:
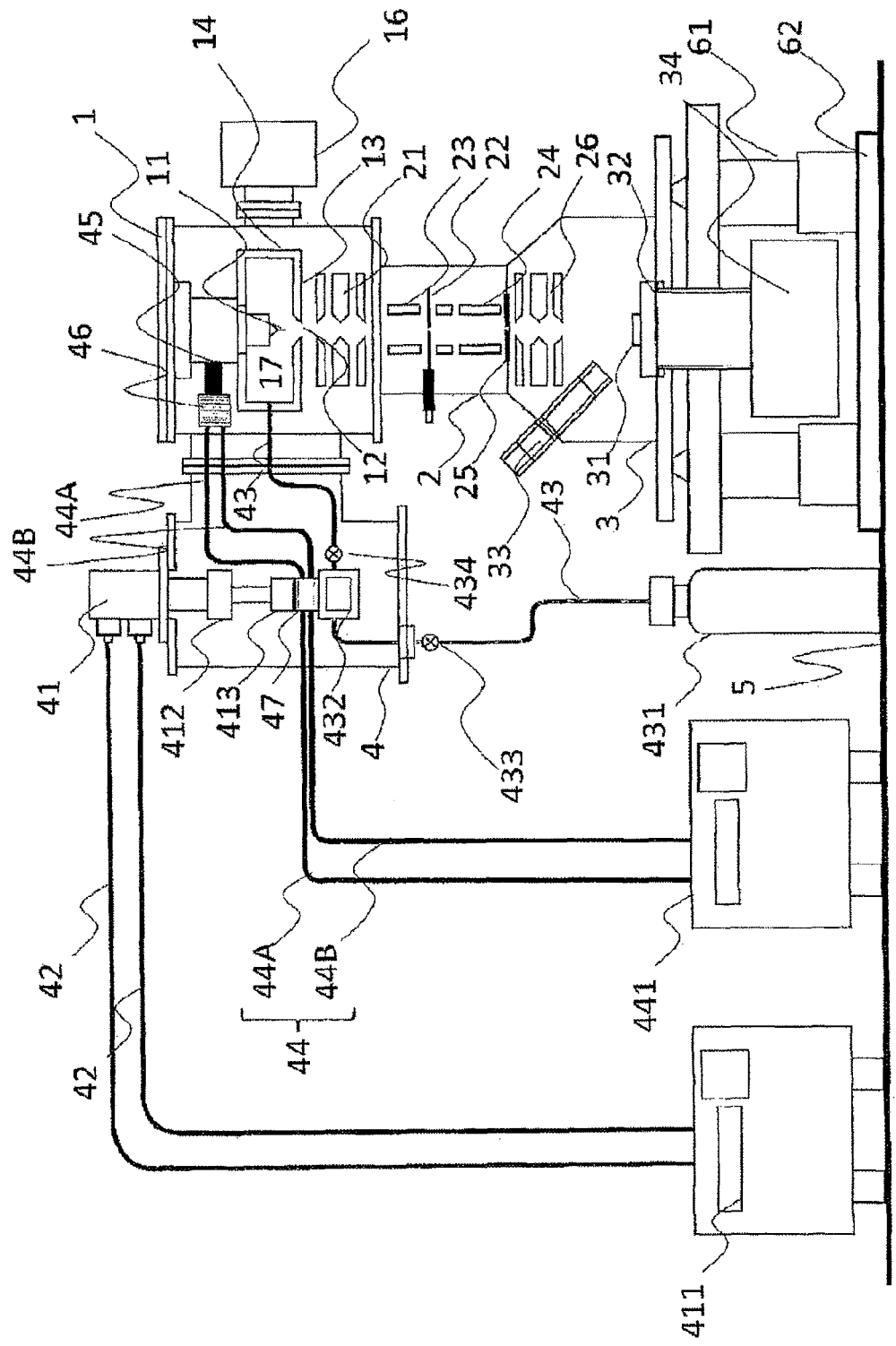
FIG. 4 is a diagram representing a schematic structure of an example of the charged particles beam apparatus according to the present invention.

Referring to FIG. 4, an example of the charged particles beam apparatus according to the present invention is described below. This example differs from FIG. 1 in that a vacuum chamber 432 that can retain the ionized gas is provided on the first gas line, and the apparatus also includes a means 434 that can adjust the flow rate of the gas inside the first gas line joining a vacuum chamber 433 and the ionization chamber. In this example, the first gas line from a gas cylinder 431 is connected to the vacuum chamber 433 via a valve 433. The gas is introduced into the ionization chamber 17 via the flow rate adjusting means 434.

This example uses a GM cryocooler. In the figure, the vacuum chamber 433 is shown as being cooled via the second heat exchanger. However, the vacuum chamber 433 may be configured to be directly connected to the second cold head. The present invention also encompasses use of more than one cryocooler. It should be noted, however, that a characteristic feature of the present invention is that the vacuum chamber 433 is cooled by the same cryocooler that cools the second gas line. Specifically, at least one cryocooler simultaneously cools the vacuum chamber 433 and the second gas line. This configuration enables supplying a high purity ionized gas to the emitter tip 11, and makes it possible to inexpensively provide a reliable ion microscope with the least number of cryocoolers.

The first gas line 43 and the second gas line 44 also may be configured to be preliminarily cooled in this example. Specifically, for example, the apparatus may be configured so that the first gas line 43 and the second gas line 44 are cooled by the first cold head 412 before the ionized gas running through the first gas line is retained by the vacuum chamber 433. The second gas line may be connected to the first cold head 412 via a heat exchanger different from the second heat exchanger, as with the foregoing example. The portions of the second gas line 44 where the refrigerant is directed toward the first heat exchanger and returns from the first heat exchanger 46 also may be connected to each other via a heat exchanger different from the second heat exchanger 47. Such an additional interconnection enables preliminary cooling of the refrigerant, and reduces the thermal load on the cryocooler, making it possible to cool the refrigerant to even lower temperatures.

With the ionized gas retained inside the cooled vacuum chamber 433, the impurity gas contained in the ionized gas aggregates on the inner wall of the vacuum chamber 433, and the purity of the ionized gas improves. In order for the apparatus to operate with the maintained high ion beam brightness, a high pressure needs to be maintained for the ionized gas inside the ionization chamber. This means that there is a need to accommodate a large consumption of high purity ionized gas for the observation of a high-resolution image. To this end, the ionized gas may be introduced in a preliminary stage before operating the ion microscope. By retaining the cooled ionized gas, the thermal load on the cryocooler can be reduced while maintaining the purity constant at all times. A large consumption of ionized gas also can be accommodated by increasing the ionized gas pressure inside the vacuum chamber 433 to the required level in a preliminary stage.

The vacuum chamber 433, the first gas line 43, and the second gas line 44 may be configured to evacuate with a vacuum pump (not illustrated). The vacuum pump may be, for example, an evaporable getter pump such as a rotary pump, a scroll pump, a turbo-molecular pump, a sputter ion pump, and a Ti sublimation, or a non-evaporable getter pump. These devices may be used alone or in a configuration as a combination of different devices to evacuate and create a vacuum. The purity of the refrigerant or ionized gas can be increased by performing preliminary evacuation with such a device configuration before introducing the refrigerant or ionized gas. The vacuum chamber 433, the first gas line 43, and the second gas line 44 may be configured to be heatable with heating means such as a heater (not illustrated). Heating with a heater or the like during preliminary evacuation can accelerate the desorption of the adsorbed gas inside the gas lines, and improve the degree of vacuum inside the gas lines prior to the introduction. That is, the purity of the ionized gas or refrigerant can improve.

Figure 5:
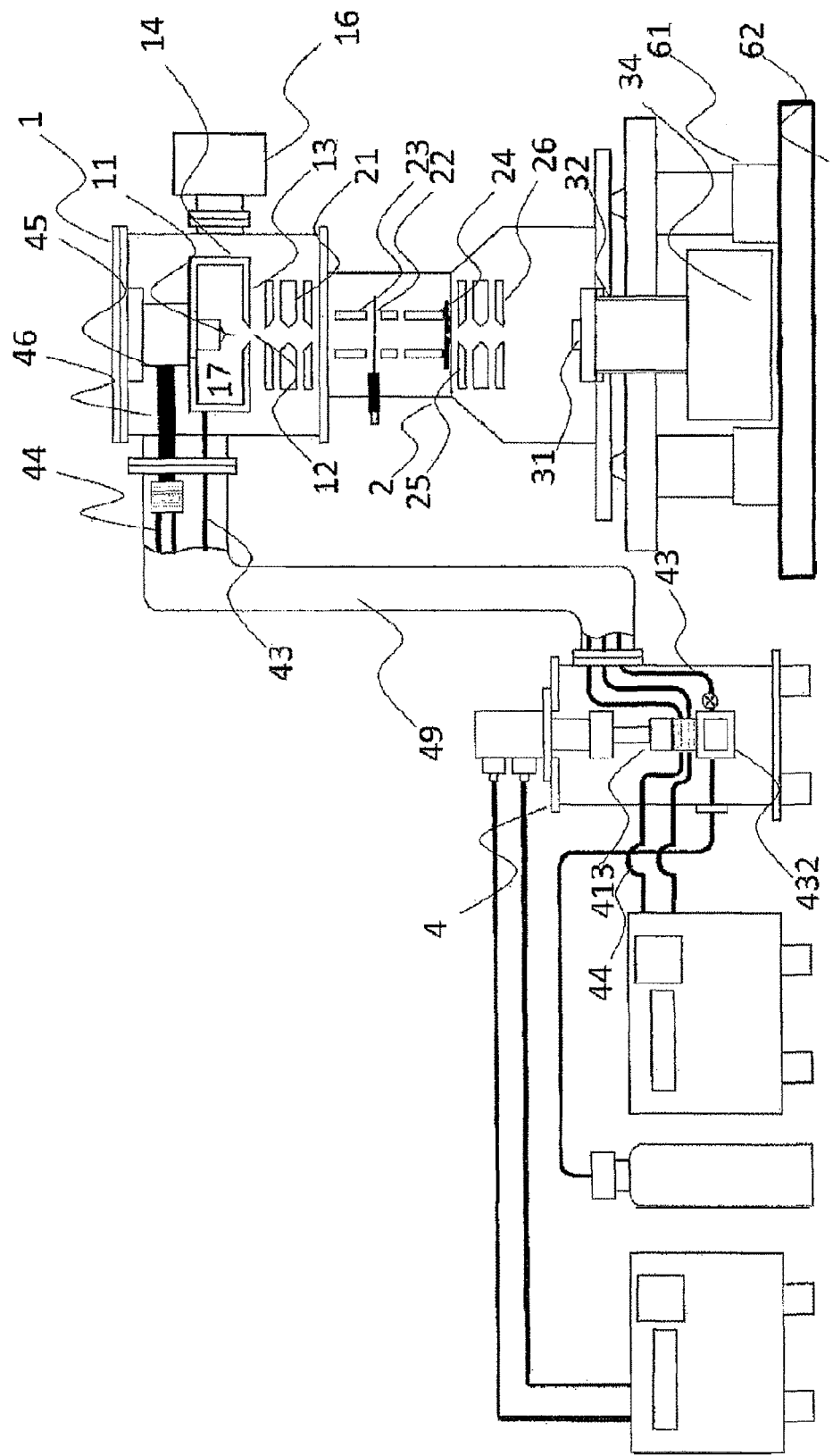
FIG. 5 is a diagram representing a schematic structure of an example of the charged particles beam apparatus according to the present invention.

Referring to FIG. 5, an example of the charged particles beam apparatus according to the present invention is described. In the scanning ion microscope of this example, the cryocooler is supported on a device mount different from the device mount supporting the scanning ion microscope main body configured from the gas field ionization ion source 1, the ion beam irradiation column, and the sample chamber 3. Specifically, the scanning ion microscope main body and the cooling mechanism 4 are supported on different device mounts. The cryocooler typically vibrates during its operation. Taking a GM cryocooler as an example, the cryocooler main body involves piston vibrations, and becomes a source of vibration. The compressor unit operating to circulate helium is another source of vibration. The apparatus is also vibrated by the bubbles that generate during the boiling of the refrigerant when a container retaining the refrigerant is used as a cryocooler. As described above, the relative vibrations of the emitter tip 11 and the sample 31 cause image resolution deterioration in a scanning ion microscope. By using different device mounts to support the cryocooler and the ion microscope main body producing vibrations, it is possible to reduce the transmission of vibrations, the deterioration of image resolution.

Because the ion microscope main body and the cooling mechanism 4 are supported on different device mounts, the first gas line 43 and the second gas line 44 need to be extended. Further, because the ionized gas running through the first gas line 43 cooled by the cooling mechanism, and the refrigerant running through the second gas line 44 are transported to the ion microscope main body in the maintained cold state, these gas lines need to be covered with a vacuum insulation pipe 49 to shield an influx of external heat. The vacuum insulation pipe 49 may be configured as a single pipe that can simultaneously vacuum insulate the first gas line and the outgoing and incoming second gas lines. The first gas line may be configured so that any part or all of the first gas line from the cooling mechanism 4 to the ionization chamber is in contact with the second gas line. With this configuration, the first gas line can be maintained in the cooled state over a wide range.

Figure 6:
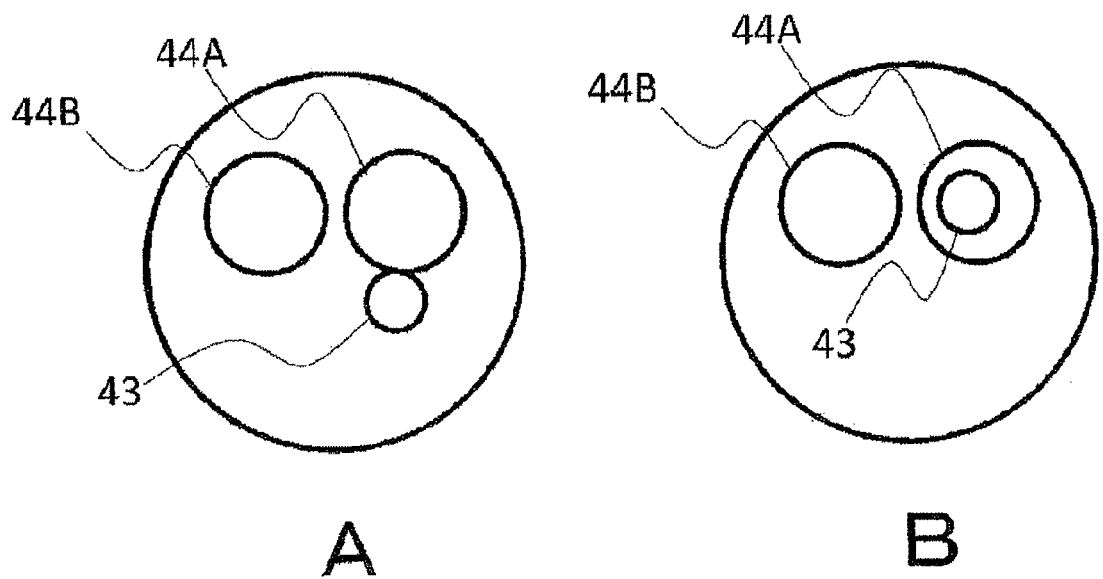
FIG. 6 is a diagram (cross sectional view) representing a schematic structure of a vacuum insulation pipe in the example of the charged particles beam apparatus according to the present invention.

FIG. 6 is a cross sectional view of the vacuum insulation pipe with the first gas line and the second gas line. FIG. 6A illustrates the first gas line 43 in contact with an outgoing second gas line 44A. FIG. 6B illustrates the first gas line contained inside the outgoing second gas line 44A.

The vacuum insulation pipe 49 may be configured so that its outer wall has a movable bellows or accordion structure in a part of the pipe or throughout the pipe (not illustrated). Because the vacuum insulation pipe 49 joins the cooling mechanism 4 and the ion microscope main body that become vibration sources, the vacuum insulation pipe 49 can transmit the vibration of the cooling mechanism 4 to the ion microscope main body. However, when the vacuum insulation pipe 49 is configured to have a movable structure as above, the vibration does not easily transmit, and the deterioration of micrograph resolution can be reduced. A part of the vacuum insulation pipe 49 having a movable structure such as above may be fixed to any of the device mount supporting the ion source main body, the device mount supporting the cooling mechanism, and a third device mount different from these device mounts. The transmission of the generated vibration from the cryogenic mechanism 4 to the ion microscope main body can be particularly suppressed by fixing the vacuum insulation pipe 49 to the third device mount.

The second gas line in FIG. 5 makes one circulation between the cryogenic mechanism 4 and the ion microscope main body. However, the second gas line may be structured to circulate the refrigerant more than once.

Figure 7:
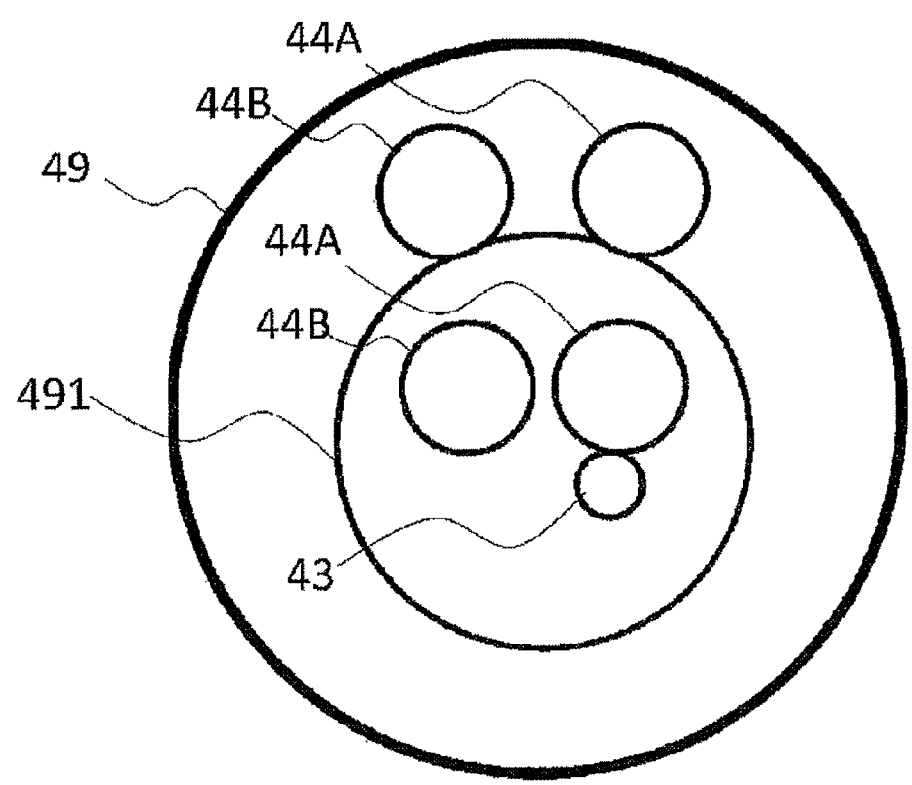
FIG. 7 is a diagram (cross sectional view) representing a schematic structure of a vacuum insulation pipe in the example of the charged particles beam apparatus according to the present invention.

FIG. 7 is a cross sectional view of a vacuum insulation pipe structured this way. In this example, the outgoing and incoming second gas lines for a first circulation are disposed inside the outgoing and incoming second gas lines provided for a second circulation. A heat radiation shield is disposed around the inner gas lines, and the outer second gas lines cool the heat radiation shield that is in contact with the outer second gas lines. This structure reduces the influx of heat into the gas lines disposed inside the heat radiation shield, and the refrigerant and the ionized gas can be transported to the ion microscope main body at the maintained low temperature.

REFERENCE SIGNS LIST

1 Gas field ionization ion source
11 Emitter tip

12 Ion passage opening
13 Extraction electrode
14 Ionization chamber outer wall
15 Ion beam
16 Ion source evacuation pump
17 Ionization chamber
2 Beam irradiation column
21 Focusing lens
22 First aperture
23 First deflector
24 Second deflector
25 Second aperture
26 Objective lens
3 Sample chamber
31 Sample
32 Sample stage
33 Secondary particle detector
34 Sample chamber evacuation pump
4 Cooling mechanism
41 Cryocooler main body
411 Compressor unit
412 First cold head
413 Second cold head
414 Liquid nitrogen retaining container
415 Evacuation pipe
42 Cryogenic pipe
43 First gas line
431 Gas cylinder
432 Vacuum chamber (gas reservoir)
433 Valve
434 Flow rate adjusting means
44 Second gas line
44A Outgoing second gas line
44B Incoming second gas line
441 Compressor unit
45 Cooling conductor
46 First heat exchanger
47 Second heat exchanger
481 Third heat exchanger
482 Fourth heat exchanger
49 Vacuum insulation pipe
491 Heat radiation shield
5 Floor
6 Device mount
61 Antivibration mechanism
62 Base plate

The invention claimed is:

1. A charged particle microscope that has a field ionization ion source, the microscope comprising:
an emitter tip having a needle-like apex;
an ionization chamber having the emitter tip inside the chamber;
a first heat exchanger connected to a part of the ionization chamber via a cooling conductor,
a cryocooler having a second heat exchanger,
a first gas line that supplies a gas to the ionization chamber via the second heat exchanger; and
a second gas line thermally connected to the first heat exchanger and the second heat exchanger.

2. The charged particle microscope according to claim 1, wherein the second heat exchanger is thermally connected to a vacuum chamber retaining a gas molecule supplied to the first gas line, and
wherein a mechanism by which a gas flow rate through the first gas line is adjusted is provided on a path between the vacuum chamber and the first gas line.

3. The charged particle microscope according to claim 2, wherein the gas running through the second gas line is partially suppliable to the ionization chamber.

4. The charged particle microscope according to claim 1, comprising:
a first device mount that holds the field ionization ion source, a sample holder for holding a sample, and a lens group for converging an ion beam; and
an antivibration mechanism that reduces a vibration of the device mount,
wherein the cryocooler is supported by a second device mount separately provided from the device mount.

5. The charged particle microscope according to claim 1, comprising a pipe that vacuum insulates the first gas line and the second gas line, wherein an outer wall of the first gas line and an outer wall of the second gas line are partially in contact with each other inside the pipe.

6. The charged particle microscope according to claim 1, wherein the cryocooler is a Gifford-McMahon cryocooler or a pulse tube cryocooler.

7. The charged particle microscope according to claim 1, wherein the cryocooler has a capacity to cool a cold head to a temperature of 70 K or less.

8. The charged particle microscope according to claim 1, wherein the cryocooler has a container capable of retaining liquid nitrogen, and
wherein the liquid nitrogen retained in the container is solidifiable upon lowering a pressure inside the container.

9. The charged particle microscope according to claim 1, wherein the gas supplied to the ionization chamber is helium gas.

* * * * *